United States Patent [19]

Chapman et al.

[11] Patent Number: 5,134,116

[45] Date of Patent: Jul. 28, 1992

[54] MIXTURE OF DYES FOR BLACK DYE DONOR FOR THERMAL COLOR PROOFING

[75] Inventors: Derek D. Chapman; Steven Evans, both of Rochester, N.Y.

[73] Assignee: Eastman Kodak Company, Rochester, N.Y.

[21] Appl. No.: 677,000

[22] Filed: Mar. 28, 1991

Related U.S. Application Data

[63] Continuation-in-part of Ser. No. 608,507, Nov. 2, 1990, abandoned.

[51] Int. Cl.$^5$ .................. B41M 5/035; B41M 5/26
[52] U.S. Cl. ............................. 503/227; 428/195; 428/913; 428/914
[58] Field of Search .............. 8/471; 428/195, 913, 428/914; 503/227

[56] References Cited

U.S. PATENT DOCUMENTS

| | | | |
|---|---|---|---|
| 3,336,285 | 8/1967 | Towne et al. | 260/155 |
| 4,816,435 | 3/1989 | Murata et al. | 503/227 |
| 4,866,029 | 9/1989 | Evans et al. | 503/227 |
| 4,923,846 | 5/1990 | Kutsukake et al. | 503/227 |

FOREIGN PATENT DOCUMENTS

| | | | |
|---|---|---|---|
| 1531071 | 11/1978 | United Kingdom | 8/662 |
| 1566985 | 5/1980 | United Kingdom | 8/662 |

OTHER PUBLICATIONS

Dyes and Pigments, vol. 3, 81 (1982).

Primary Examiner—Bruce H. Hess
Attorney, Agent, or Firm—Harold E. Cole

[57] ABSTRACT

A black dye-donor element for thermal dye transfer comprising a support having thereon a dye layer comprising a mixture of at least one cyan, magenta and yellow dyes dispersed in a polymeric binder, at least one of the cyan dyes having the formula:

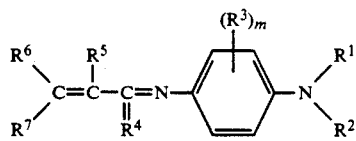

and at least one of the yellow dyes having the formula:

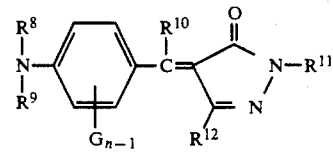

and at least one of the magenta dyes having the formula:

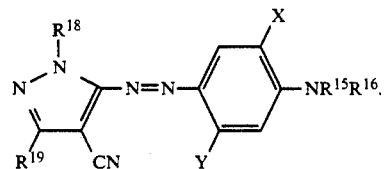

17 Claims, No Drawings

MIXTURE OF DYES FOR BLACK DYE DONOR FOR THERMAL COLOR PROOFING

This application is a continuation-in-part of copending U.S. Ser. No. 608,507, filed Nov. 2, 1990, now abandoned.

This invention relates to use of a mixture of cyan, yellow and magenta dyes in a black dye-donor element for thermal dye transfer imaging which can be used in a four-color proofing system that accurately represents the hue of a printed color image obtained from a printing press.

In order to approximate the appearance of continuous-tone (photographic) images via ink-on-paper printing, the commercial printing industry relies on a process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained on the printing press. In many cases, it is also desirable that the color proof accurately represent the image quality and halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled. Colorants that are used in the printing industry are insoluble pigments. In particular, carbon is often used in such a black ink and results in fairly uniform absorbance across the visible spectrum. In thermal transfer color printing systems that use diffusible dyes it is often difficult to find a blend of two or more dyes which yields both uniform neutral (black) color and fulfills the other requirements of the printing system such as transfer efficiency and donor storage stability. In U.S. patent application Ser. No. 514,643, filed Apr. 25, 1990, of DeBoer, a process is described for producing a direct digital, halftone color proof of an original image on a dye-receiving element. The proof can then be used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second dye image-receiving element which has the same substrate as the printed color image.

In the above process, multiple dye-donors are used to obtain a complete range of colors in the proof. For example, for a full-color proof, four colors: cyan, magenta, yellow and black are normally used.

By using the above process, the image dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the original image.

Similarly, a thermal transfer proof can be generated by using a thermal head in place of a diode laser as described in U.S. Pat. No. 4,923,846. Commonly available thermal heads are not capable of generating halftone images of adequate resolution but can produce high quality continuous tone proof images which are satisfactory in many instances. U.S. Pat. No. 4,923,846 also discloses the choice of mixtures of dyes for use in thermal imaging proofing systems. The dyes are selected on the basis of values for hue error and turbidity. The Graphic Arts Technical Foundation Research Report No. 38, "Color Material" (58-(5) 293–301, 1985 gives an account of this method.

An alternative and more precise method for color measurement and analysis uses the concept of uniform color space known as CIELAB in which a sample is analyzed mathematically in terms of its spectrophotometric curve, the nature of the illuminant under which it is viewed and the color vision of a standard observer. For a discussion of CIELAB and color measurement, see "Principles of Color Technology", 2nd Edition, p. 25–110, Wiley-Interscience and "Optical Radiation Measurements", Volume 2, p. 33–145, Academic Press.

In using CIELAB, colors can be expressed in terms of three parameters: $L^*$, $a^*$ and $b^*$, where $L^*$ is a lightness function, and $a^*$ and $b^*$ define a point in color space. Thus, a plot of $a^*$ v. $b^*$ values for a color sample can be used to accurately show where that sample lies in color space, i.e., what its hue is. This allows different samples to be compared for hue if they have similar density and $L^*$ values.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p. 55.

Thus, this invention relates to the use of a mixture of cyan, yellow and magenta dyes for thermal dye transfer imaging to approximate a hue match of the black SWOP Color Reference. The mixtures of dyes described in this invention provide a closer hue match to the SWOP standard and better transfer density than the preferred dye mixtures of U.S. Pat. No. 4,923,846.

In U.S. Pat. No. 4,816,435, a combination of thermally transferable dyes is disclosed for use in producing black images. The dye types disclosed are di- and tricyanovinylanilines (for the yellow and magenta respectively) and phenol-based indoaniline cyan dyes. There is a problem with using these dyes in dye-donors in that the storage stability is not as good as one would like it to be. It would be desirable to provide a black dye-donor with good storage stability.

Accordingly, this invention relates to a black dye-donor element for thermal dye transfer comprising a support having thereon a dye layer comprising a mixture of cyan, yellow and magenta dyes dispersed in a polymeric binder, at least one of the cyan dyes having the formula:

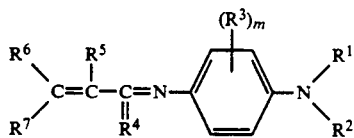

wherein $R^1$ and $R^2$ each independently represents hydrogen; an alkyl group having from 1 to about 10 carbon atoms; a cycloalkyl group having from about 5 to about 7 carbon atoms; allyl; or such alkyl, cycloalkyl or allyl groups substituted with one or more groups such as alkyl, aryl, alkoxy, aryloxy, amino, halogen, nitro, cyano, thiocyano, hydroxy, acyloxy, acyl, alkoxycarbonyl, aminocarbonyl, alkoxycarbonyloxy, carbamoyloxy, acylamido, ureido, imido, alkylsulfonyl, arylsulfonyl, alkylsulfonamido, arylsulfonamido, alkylthio, arylthio, trifluoroethyl, etc., e.g., methyl, ethyl, propyl, isopropyl, butyl, pentyl, hexyl, methoxyethyl, benzyl, 2-methanesulfonamidoethyl, 2-hydroxyethyl,2-cyanoethyl, methoxycarbonylmethyl, cyclohexyl, cyclopentyl, phenyl, pyridyl, naphthyl, thienyl, pyrazolyl, p-tolyl, p-chlorophenyl, m-(N-methyl-sulfamoyl)phenylmethyl, methylthio, butylthio, benzylthio, methanesulfonyl, pentanesulfonyl, methoxy, ethoxy, 2-methane-sulfonamidoethyl, 2-hydroxyethyl, 2-cyanoethyl, methoxy-carbonylmethyl, imidazolyl, naphthyloxy, furyl, p-tolylsulfonyl, p-chlorophenylthio, m-(N-methyl sulfamoyl)-phenoxy, ethoxy-carbonyl, methoxyethoxycarbonyl, phenoxy-carbonyl, acetyl, benzoyl, N,N-dimethylcarbamoyl, dimethylamino, morpholino, anilino, pyrrolidino etc.; with the proviso that $R^1$ and $R^2$ cannot both be hydrogen;

or $R^1$ and $R^2$ can be joined together to form, along with the nitrogen to which they are attached, a 5- to 7-membered heterocyclic ring such as morpholine or pyrrolidine;

or either or both of $R^1$ and $R^2$ can be combined with an $R^3$ to form a 5- to 7-membered heterocyclic ring;

each $R^3$ independently represents substituted or unsubstituted alkyl, cycloalkyl or allyl as described above for $R^1$ and $R^2$; alkoxy, aryloxy, halogen, thiocyano, acylamido, ureido, alkylsulfonamido, arylsulfonamido, alkylthio, arylthio or trifluoromethyl;

or any two of $R^3$ may be combined together to form a 5- or 6-membered carbocyclic or heterocyclic ring; or one or two of $R^3$ may be combined with either or both of $R^1$ and $R^2$ to complete a 5- to 7-membered ring;

m is an integer of from 0 to 4;

$R^4$ represents hydrogen or an electron withdrawing group such as cyano, alkoxycarbonyl, aminocarbonyl, alkylsulfonyl, arylsulfonyl, acyl, nitro, etc.;

$R^5$ represents an electron withdrawing group such as those listed above for $R^4$; an aryl group having from about 6 to about 10 carbon atoms; a hetaryl group having from about 5 to about 10 atoms; or such aryl or hetaryl groups substituted with one or more groups such as are listed above for $R^1$ and $R^2$;

$R^6$ and $R^7$ each independently represents an electron withdrawing group such as those described above for $R^4$; or $R^6$ and $R^7$ may be combined to form the residue of an active methylene compound such as a pyrazolin-5-one, a pyrazoline-3,5-dione, a thiohydantoin, a barbituric acid, a rhodanine, a furanone, an indandione, etc., and at least one of the yellow dyes having the formula:

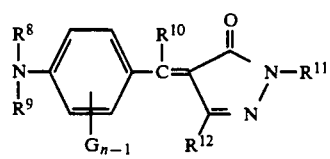

wherein:

$R^8$, $R^9$ and $R^{11}$ each independently represents a substituted or unsubstituted alkyl group of from 1 to about 10 carbon atoms, such as those listed above for $R^1$; a cycloalkyl group of from about 5 to about 7 carbon atoms, such as those listed above for $R^1$; an allyl group, such as those listed above for $R^1$; or an aryl group having from about 6 to about 10 carbon atoms, such as phenyl, naphthyl, p-tolyl, m-chlorophenyl, p-methoxyphenyl, m-bromophenyl, o-tolyl, etc.;

or $R^8$ and $R^9$ can be joined together to form, along with the nitrogen to which they are attached, a 5- or 6-membered heterocyclic ring, such as a pyrrolidine or morpholine ring;

or either or both of $R^8$ and $R^9$ can be joined to the carbon atom of the benzene ring at a position ortho to the position of attachment of the anilino nitrogen to form a 5- or 6-membered ring, thus forming a polycyclic system such as 1,2,3,4-tetrahydroquinoline, julolidine, 2,3-dihydroindole, or benzomorpholine;

$R^{10}$ represents hydrogen; a substituted or unsubstituted alkyl group of from 1 to about 10 carbon atoms, such as those listed above for $R^1$; a cycloalkyl group of from about 5 to about 7 carbon atoms, such as those listed above for $R^1$; an allyl group, such as those listed above for $R^1$; halogen; carbamoyl, such as N,N-dimethylcarbamoyl; or alkoxycarbonyl, such as ethoxycarbonyl or methoxyethoxy-carbonyl;

$R^{12}$ represents a substituted or unsubstituted alkoxy group having from 1 to about 10 carbon atoms, such as methoxy, ethoxy, methoxyethoxy or 2-cyanoethoxy; a substituted or unsubstituted aryloxy group having from about 6 to about 10 carbon atoms, such as phenoxy, m-chlorophenoxy, or naphthoxy; $NHR^{13}$; $NR^{13}R^{14}$ or the atoms, such as O, $CH_2$, S, $NR^{13}$, etc., necessary to complete a 6-membered ring fused to the benzene ring;

$R^{13}$ and $R^{14}$ each independently represents any of the groups for $R^8$, or $R^{13}$ and $R^{14}$ may be joined together to form, along with the nitrogen to which they are attached, a 5- or 6-membered heterocyclic ring, such as a pyrrolidine or morpholine ring;

n is a positive integer from 1 to 5; and

G represents a substituted or unsubstituted alkyl or alkoxy group of from 1 to about 10 carbon atoms, such as those listed above for $R^1$ and $R^{12}$; halogen; aryloxy; or represents the atoms necessary to complete a 5- or 6-membered ring, thus forming a fused ring system such as naphthalene, quinoline, isoquinoline or benzothiazole;
and at least one of the magenta dyes having the formula:

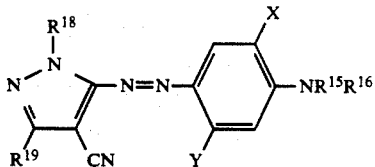

III wherein
$R^{15}$ is a substituted or unsubstituted alkyl or allyl group of from 1 to about 10 carbon atoms, such as those listed above for $R^1$;
X is an alkoxy group of from 1 to about 4 carbon atoms or represents the atoms which when taken together with $R^{16}$ forms a 5- or 6-membered ring;
$R^{16}$ is any of the groups for $R^{15}$ or represents the atoms which when taken together with X forms a 5- or 6-membered ring;
Y is $R^{15}$, an alkoxy group of from 1 to about 4 carbon atoms, hydrogen, halogen, or $NHJR^{17}$;
$R^{17}$ is a substituted or unsubstituted alkyl group of from 1 to about 10 carbon atoms such as those listed above for $R^1$, or a substituted or unsubstituted aryl group of from about 6 to about 10 carbon atoms such as phenyl, naphthyl, p-tolyl, m-chlorophenyl, p-methoxyphenyl, m-bromophenyl, o-tolyl, etc.; J is CO, $CO_2$, $-SO_2-$ or $CONR^{20}-$;
$R^{18}$ is a substituted or unsubstituted alkyl or allyl group of from 1 to about 10 carbon atoms, such as those listed above for $R^1$, or a substituted or unsubstituted aryl group of from about 6 to about 10 carbon atoms, such as those listed above for $R^{17}$;
$R^{19}$ is hydrogen, cyano, a substituted or unsubstituted alkyl group of from 1 to about 10 carbon atoms, such as those listed above for $R^1$, or a substituted or unsubstituted aryl group of from about 6 to about 10 carbon atoms, such as those listed above for $R^{17}$; and
$R^{20}$ is hydrogen or $R^{18}$.

In a preferred embodiment for compounds according to formula I employed in the invention, $R^4$, $R^6$ and $R^7$ are cyano. In another preferred embodiment for compounds according to formula I employed in the invention, $R^1$ is $C_2H_5$, $C_2H_4OH$, or $n-C_3H_7$. In yet another preferred embodiment for compounds according to formula I employed in the invention, $R^2$ is $C_2H_5$ or $n-C_3H_7$. In yet still another preferred embodiment for compounds according to formula I employed in the invention, $R^3$ is hydrogen, $OC_2H_5$, $CH_3$ or $NHCOCH_3$. In another preferred embodiment for compounds according to formula I employed in the invention, $R^5$ is $p-C_6H_4Cl$, $m-C_6H_4NO_2$ or naphthyl.

Compounds included within the scope of formula I employed in the invention include the following:

| Compound | $R^1$ | $R^2$ | $R^3$ | $R^5$ |
|---|---|---|---|---|
| 1 | $C_2H_5$ | $C_2H_5$ | $CH_3$ | $C_6H_5$ |
| 2 | $C_2H_5$ | $C_2H_5$ | H | $C_6H_5$ |
| 3 | $C_2H_4OH$ | $C_2H_5$ | $CH_3$ | $C_6H_5$ |
| 4 | $C_2H_5$ | $C_2H_5$ | $OC_2H_5$ | $C_6H_5$ |
| 5 | $n-C_3H_7$ | $n-C_3H_7$ | $NHCOCH_3$ | $C_6H_5$ |
| 6 | $C_2H_5$ | $C_2H_5$ | $CH_3$ | $o-C_6H_4OCH_3$ |
| 7 | $C_2H_5$ | $C_2H_5$ | $CH_3$ | $p-C_6H_4OCH_3$ |
| 8 | $C_2H_5$ | $C_2H_5$ | $CH_3$ | $p-C_6H_4Cl$ |
| 9 | $C_2H_5$ | $C_2H_5$ | $CH_3$ | $m-C_6H_4NO_2$ |
| 10 | $C_2H_5$ | $C_2H_5$ | $CH_3$ | 1-naphthyl |
| 11 | $C_2H_5$ | $C_2H_5$ | $CH_3$ | 2-naphthyl |
| 12 | $C_2H_5$ | $C_2H_5$ | $CH_3$ | benzofuranyl |
| 13 | $C_2H_5$ | $C_2H_5$ | H | benzofuranyl |
| 14 | $C_2H_5$ | $C_2H_5$ | $CH_3$ | $p-C_6H_4F$ |
| 15 | $C_2H_5$ | $C_2H_5$ | $CH_3$ | $o-C_6H_4Cl$ |

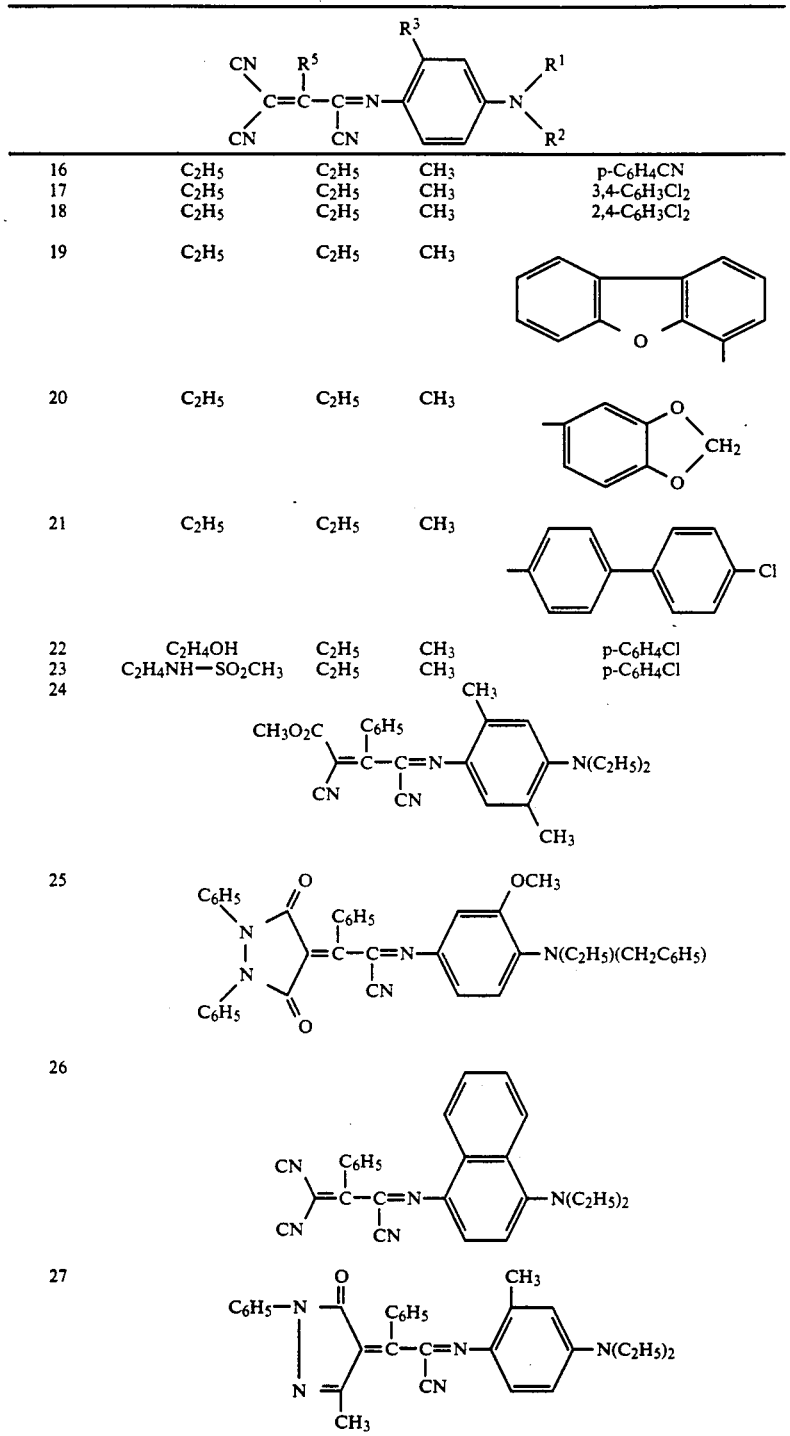

The above dyes may be prepared analogously to the method described in Example 1 below.

In a preferred embodiment for compounds according to formula II employed in the invention, $R^{11}$ is phenyl; $R^{12}$ is ethoxy or $NHR^{13}$, wherein $R^{13}$ is methyl or phenyl; n is 1; and $R^{10}$ is hydrogen.

In another preferred embodiment for compounds according to formula II employed in the invention, $R^{12}$ is O and completes a 6-membered ring fused to the benzene ring. In another preferred embodiment for compounds according to formula II employed in the invention, $R^{12}$ is $NH^{13}R^{14}$, wherein each $R^{13}$ and $R^{14}$ is methyl or $R^{13}$ is ethyl and $R^{14}$ is phenyl.

In another preferred embodiment for compounds according to formula II employed in the invention, $R^{12}$ is $NR^{13}R^{14}$, wherein $R^{13}$ and $R^{14}$ are joined together to form, along with the nitrogen to which they are attached, a pyrrolidine or morpholine ring.

The compounds of formula II employed in the invention above may be prepared by any of the processes disclosed in U.S. Pat. No. 4,866,029, the disclosure of which is hereby incorporated by reference.

Compounds included within the scope of formula II employed in the invention include the following:

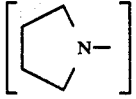

| Cmpd. | G | R⁸ | R⁹ | R¹⁰ | R¹¹ | R¹² |
|---|---|---|---|---|---|---|
| II-1 | H | C₂H₅ | C₂H₅ | H | C₆H₅ | N(CH₃)₂ |
| II-2 | H | CH₃ | CH₃ | H | C₆H₅ | N(CH₃)₂ |
| II-3 | H | n-C₄H₉ | n-C₄H₉ | H | C₆H₅ | N(CH₃)₂ |
| II-4 | 3-CH₃ | C₂H₅ | CF₃CH₂O₂CCH₂ | H | C₆H₅ | N(CH₃)₂ |
| II-5 | H |  | | H | C₆H₅ | N(CH₃)₂ |
| II-6 | H | C₂H₅ | C₂H₅ | H | C₆H₅ | NHC₆H₅ |
| II-7 | H | C₂H₅ | C₂H₅ | H | C₆H₅ | 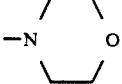 |
| II-8 | H | C₂H₅ | C₂H₅ | H | C₆H₅ | 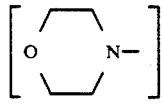 |
| II-9 | H | C₂H₅ | C₂H₅ | H | C₆H₅ | NHCH₃ |
| II-10 | H | C₂H₅ | C₂H₅ | H | C₆H₅ | N(C₂H₅)—(C₆H₅) |
| II-11 | 3-OCH₃ | C₂H₅ | C₂H₅ | H | C₆H₅ | N(CH₃)₂ |
| II-12 | H | n-C₄H₉ | n-C₄H₉ | H | C₆H₅ | OC₂H₅ |
| II-13 | 3-Cl | CH₃ | C₂H₅O₂CCH₂ | H | C₁₀H₉ | N(CH₃)₂ |
| II-14 | H | 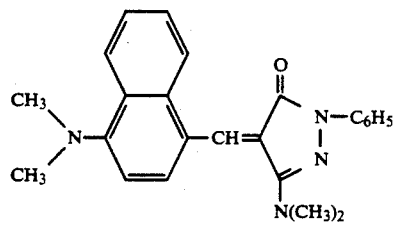 | | H | 4-Cl—C₆H₄ | OCH₃ |
| II-15 | 3-CH₃ | ClC₂H₄ | ClC₂H₄ | H | CH₂C₆H₅ | OC₆H₅ |
| II-16 | 3-C₂H₅ | C₆H₅CH₂ | C₂H₅ | H | CH₃ | N(CH₃)₂ |
| II-17 | 2,5-(OCH₃)₂ | CH₃ | CH₃ | H | 3,5-(Cl)₂—C₆H₃ | NHCH₃ |
| II-18 | H | CH₃ | CH₃ | CO₂C₂H₅ | C₆H₅ | N(CH₃)₂ |
| II-19 | H | CH₃ | CH₃ | Cl | C₆H₅ | N(CH₃)₂ |
| II-20 | 3-CH₃ | C₂H₅ | C₆H₅CH₂ | H | C₆H₅ | OC₂H₅ |
| II-21 | H | C₂H₅ | C₂H₅ | H | C₆H₅ | OC₃H₇-i |
| II-22 | 3-CH₃ | C₂H₅ | C₂H₅ | H | C₆H₅ | OC₂H₅ |
| II-23 | | | | | | |

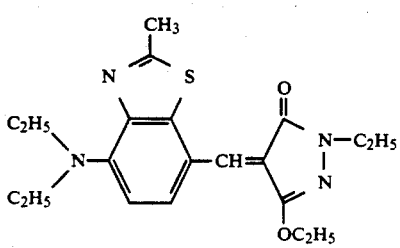

II-24

-continued

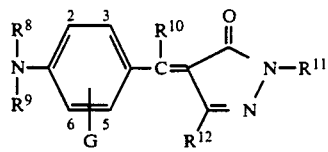

II-25 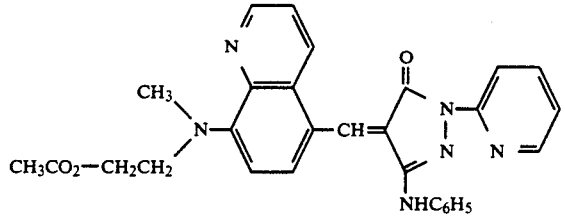

II-26 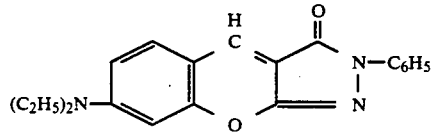

II-27 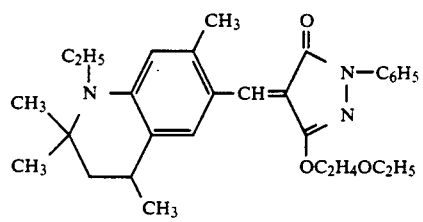

II-28 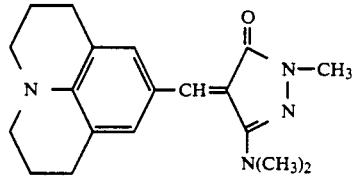

II-29 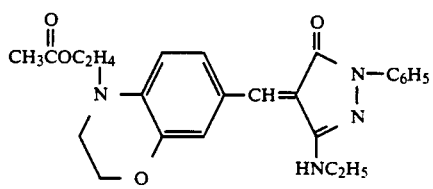

II-30 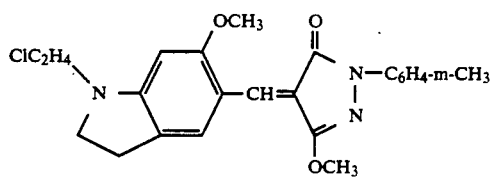

In a preferred embodiment for compounds according to formula III employed in the invention, $R^{15}$ and $R^{16}$ are each ethyl, X is $OCH_3$, J is CO, $R^{17}$ and $R^{18}$ are each $CH_3$, and $R^{19}$ is $C_4H_9$-t. In another preferred embodiment of the invention, $R^{15}$ and $R^{16}$ are each ethyl, X is $OCH_3$, J is CO, $R^{17}$ is $CH_3$, $R^{18}$ is $CH_2CHOHCH_3$, and $R^{19}$ is $C_4H_9$-t.

The compounds of formula III above employed in the invention may be prepared by any of the processes disclosed in U.S. Pat. No. 3,336,285, BR 1,566,985, UK 1,531,071 and Dyes and Pigments, Vol 3, 81 (1982), the disclosures of which are hereby incorporated by reference.

Magenta dyes included within the scope of formula III include the following:

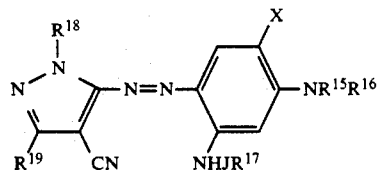

| Dye | $R^{15}$ | $R^{16}$ | $R^{17}$ | $R^{18}$ | $R^{19}$ | X | J |
|---|---|---|---|---|---|---|---|
| III-1 | $C_2H_5$ | $C_2H_5$ | $CH_3$ | $CH_3$ | $C_4H_9\text{-}t$ | $OCH_3$ | CO |
| III-2 | $C_2H_5$ | $C_2H_5$ | $CH_3$ | $CH_2CH\text{—}OHCH_3$ | $C_4H_9\text{-}t$ | $OCH_3$ | CO |
| III-3 | $C_3H_7$ | $C_3H_7$ | $CH_3$ | $CH_3$ | $C_4H_9\text{-}t$ | $OCH_3$ | CO |
| III-4 | $C_2H_5$ | $C_2H_5$ | $C_4H_9\text{-}t$ | $CH_3$ | $CH_3$ | $OCH_3$ | CO |
| III-5 | $C_2H_5$ | $C_2H_5$ | $CH_3$ | $C_2H_5$ | $C_4H_9\text{-}t$ | $OC_2H_5$ | $SO_2$ |
| III-6 | $C_2H_5$ | $C_2H_5$ | $C_2H_5$ | $CH_3$ | $CH_3$ | $OC_2H_5$ | CO |
| III-7 | $C_2H_5$ | $C_3H_7$ | $CH_3$ | $CH_3$ | $C_4H_9\text{-}t$ | $OCH_3$ | CO |
| III-8 | $C_2H_5$ | $C_2H_5$ | $CH_3$ | $CH_3$ | $C_4H_9\text{-}t$ | $OCH_3$ | $CO_2$ |
| III-9 | $C_2H_5$ | $C_2H_5$ | $C_6H_5$ | $C_3H_7$ | $C_4H_9\text{-}t$ | $OC_2H_5$ | $SO_2$ |
| III-10 | $CH_2=CH\text{—}CH_2$ | $CH_2=CH\text{—}CH_2$ | $CH_3$ | $CH_2C_6H_5$ | $C_4H_9\text{-}t$ | $OCH_3$ | CO |
| III-11 | $C_3H_7$ | $C_3H_7$ | $C_2H_5$ | $CH_2CN$ | CN | $OC_3H_7$ | CO |
| III-12 | $C_3H_7$ | $C_3H_7$ | $C_2H_5$ | $C_6H_5$ | $CH_3$ | $OC_3H_7$ | $SO_2$ |

III-13

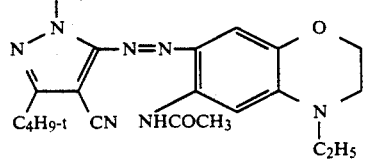

III-14

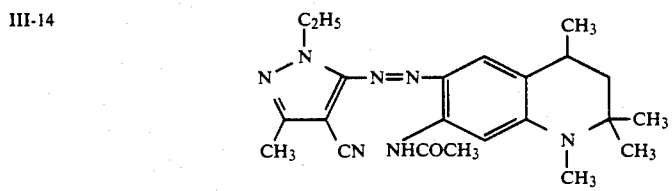

III-15

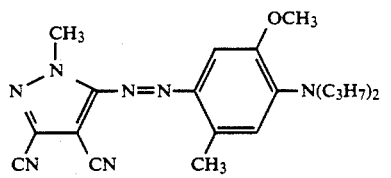

III-16

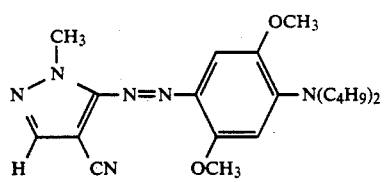

The use of dye mixtures in the dye-donor of the invention permits a wide selection of hue and color that enables a close hue match to a variety of printing inks and also permits easy transfer of images one or more times to a receiver if desired. The use of dyes also allows easy modification of image density to any desired level. The dyes of the dye-donor element of the invention may be used at a coverage of from about 0.05 to about 1 g/m².

The dyes in the dye-donor of the invention are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; polyvinyl acetate; poly(styrene-co-acrylonitrile); a poly(sulfone) or a poly(phenylene oxide). The binder may be used at a coverage of from about 0.1 to about 5 g/m².

The dye layer of the dye-donor element may be coated on the support or printed theron by a printing technique such as a gravure process.

Any material can be used as the support for the dye-donor element of the invention provided it is dimensionally stable and can withstand the heat of the laser or thermal head. Such materials include polyesters such as poly(ethylene terephthalate); polyamides; polycarbonates; celulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polropylene or methylpentene polymers; and polyimides such as polyimide-amides and polyether-imides. The support generally has a thickness of from about 5 to about 200 μm. It may also be coated with a subbing layer, if desired, such as those materials described in U.S. Pat. No(s). 4,695,288 or 4,737,486.

The reverse side of the dye-donor element may be coated with a slipping layer to prevent the printing head from sticking to the dye-donor element. Such a slipping layer would comprise either a solid or liquid lubricating material or mixtures thereof, with or without a polymeric binder or a surface active agent. Preferred lubricating materials include oils or semi-crystalline organic solids that melt below 100° C. such as poly(vinyl stearate), beeswax, perfluorinated alkyl ester polyethers, poly(capro-lactone), silicone oil, poly(tetrafluoroethylene), carbowax, poly(ethylene glycols), or any of those materials disclosed in U.S. Pat. No(s). 4,717,711; 4,717,712; 4,737,485; and 4,738,950. Suitable polymeric binders for the slipping layer include poly(vinyl alcohol-co-butyral), poly(vinyl alcohol-co-acetal), poly(-styree), poly(vinyl acetate), cellulose acetate butyrate, cellulose acetate propionate, cellulose acetate or ethyl cellulose.

The amount of the lubricating material to be used in the slipping layer depends largely on the type of lubricating material, but is generally in the range of about 0.001 to about 2 g/m². If a polymeric binder is employed, the lubricating material is present in the range of 0.1 to 50 weight %, preferably 0.5 to 40, of the polymeric binder employed.

The dye-receiving element that is used with the dye-donor element of the invention usually comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the dye-receiving element may also be reflective such as baryta-coated paper, polyethylene-coated paper, an ivory paper, a condenser paper or a synthetic paper such as duPont Tyvek ®. Pigmented supports such as white polyester (transparent polyester with white pigment incorporated therein) may also be used.

The dye image-receiving layer may comprise, for example, a polycarbonate, a polyurethane, a polyester, polyvinyl chloride, poly(styrene-co-acrylonitrile), poly(caprolactone), a poly(vinyl acetal) such as poly(vinyl alcohol-co-butyral), poly(vinyl alcohol-co-benzal), poly(vinyl alcohol-co-acetal) or mixtures thereof. The dye image-receiving layer may be present in any amount which is effective for the intended purpose. In general, good results have been obtained at a concentration of from about 1 to about 5 g/m².

As noted above, the dye-donor elements of the invention are used to form a dye transfer image. Such a process comprises imagewise-heating a dye-donor element as described above and transferring a dye image to a dye-receiving element to form the dye transfer image.

The dye-donor element of the invention may be used in sheet form or in a continuous roll or ribbon. If a continuous roll or ribbon is employed, it may have only the dyes thereon as described above or may have alternating areas of other different dyes or combinations, such as sublimable cyan and/or yellow and/or black or other dyes. Such dyes are disclosed in U.S. Pat. No. 4,541,830, the disclosure of which is hereby incorporated by reference. Thus, one-, two-, three- or four-color elements (or higher numbers also) are included within the scope of the invention.

Thermal printing heads which can be used to transfer dye from the dye-donor elements of the invention are available commercially. There can be employed, for example, a Fujitsu Thermal Head (FTP-040 MCSOO1), a TDK Thermal Head F415 HH7-1089 or a Rohm Thermal Head KE 2008-F3.

A laser may also be used to transfer dye from the dye-donor elements of the invention. When a laser is used, it is preferred to use a diode laser since it offers substantial advantages in terms of its small size, low cost, stability, reliability, ruggedness, and ease of modulation. In practice, before any laser can be used to heat a dye-donor element, the element must contain an infra-red-absorbing material, such as carbon black, cyanine infrared absorbing dyes as described in DeBoer application Ser. No. 463,095, filed Jan. 10, 1990, or other materials as described in the following U.S. application Ser. No(s). 366,970, 367,062, 366,967, 366,968, 366,969, 367,064, 367,061, 369,494, 366,952, 369,493, 369,492, and 369,491, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat.

Lasers which can be used to transfer dye from dye-donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in copending U.S. application Ser. No. 451,656 of Baek and DeBoer, filed Dec. 18, 1989, the disclosure of which is hereby incorporated by reference.

Spacer beads may be employed in a separate layer over the dye layer of the dye-donor in the above-described laser process in order to separate the dye-donor from the dye-receiver during dye transfer, thereby increasing the uniformity and density of the transferred image. That invention is more fully described in .U.S. Pat. No. 4,772,582, the disclosure of which is hereby incorporated by reference. Alternatively, the spacer beads may be employed in the receiving layer of the dye-receiver as described in U.S. Pat. No. 4,876,235, the disclosure of which is hereby incorporated by reference. The spacer beads may be coated with a polymeric binder if desired.

The use of an interadiate receiver with subsequent retransfer to a second receiving element may also be employed in the invention. A multitude of different substrates can be used to prepare the color proof (the second receiver) which is preferably the same substrate used for the printing press run. Thus, this one intermediate receiver can be optimized for efficient dye uptake without de-smearing or crystallization.

Examples of substrates which may be used for the second receiving element (color proof) include the following: Flo Kote Cove ® (S. D. Warren Co.), Champion Textweb ® (Champion Paper Co.), Quintessence Gloss ® (Potlatch Inc.), Vintage Gloss; (Potlatch Inc.), Khrome Kote ® (Champion Paper Co.), Co; Consolith Gloss ® (Consolidated Papers Co.), Ad-Proof Paper ® (Appleton Papers, Inc.) and Mountie Matte (Potlatch Inc.).

As noted above, after the dye image is obtained on a first dye-receiving element, it is retransferred to a second dye image-receiving element. This can be accomplished, for example, by passing the two receivers between a pair of heated rollers. Other methods of retransferring the dye image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors-red, blue and green, and then converting the light energy into electrical energy. The electrical signals are then modified by computer to form the color separation data which is used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

A thermal dye transfer assemblage of the invention comprises
a) a dye-donor element as described above, and
b) a dye-receiving element as described above, the dye-receiving element being in a superposed relationship with the dye-donor element so that the dye layer of the donor element is in contact with the dye image-receiving layer of the receiving element.

The above assemblage comprising these two elements may be preassembled as an integral unit when a monochrome image is to be obtained. This may be done by temporarily adhering the two elements together at their margins. After transfer, the dye-receiving element is then peeled apart to reveal the dye transfer image.

When a three-color image is to be obtained, the above assemblage is formed three times using different dye-donor elements. After the first dye is transferred, the elements are peeled apart. A second dye-donor element (or another area of the donor element with a different dye area) is then brought in register with the dye-receiving element and the process repeated. The third color is obtained in the same manner.

The following examples are provided to illustrate the invention.

EXAMPLE 1 SYNTHESIS OF COMPOUND 1

A. Synthesis of 2-phenyl-1,1,3-tricyano-propene (intermediate for Compound 1)

A mixture of benzoylacetonitrile (9.94 g, 0.0685 mole), malononitrile (11.3 g, 0.17 mole), ammonium acetate (5.4 g, 0.07 mole) and ethanol (100 mL) was heated at reflux for 1.5 hours. After cooling to room temperature, the reaction mixture was diluted with water (50 mL) and concentrated hydrochloric acid (7.5 mL) was added dropwise over 5 minutes. The resulting precipitate was collected by filtration and washed with water and ligroin. The yield was 10.0 g (76%), m.p. 92°–98° C.

B. Synthesis of Compound 1: 2-phenyl-1,1,3-tricyano-3-(4-diethylamino-2-methyl-phenylimino)-propene

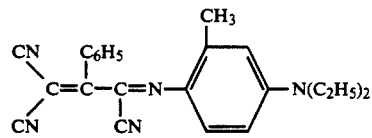

A mixture of the phenyltricyanopropene above (0.58 g, 0.003 mole) and 2-amino-5-diethylaminotoluene hydrochloride (0.64 g, 0.003 mole) in a solution of methanol (30 mL) and water (10 mL) was treated with concentrated ammonium hydroxide (1.8 mL). To this mixture was slowly added a solution of potassium ferricyanide (4.94 g, 0.015 ,le) in water (20 mL), keeping the temperature below 20° C. with external cooling. After stirring for 2 hours, the reaction mixture was diluted with water (100 mL) and the resulting precipitate was collected by filtration and washed well with water. The crude dye was crystallized from methanol to yield 0.85 g (81%) of a dark green powder. The dye had a lambda max of 604 nm with a molar extinction coefficient of 44,200 (in acetone solution).

EXAMPLE 2

A black dye-donor element was prepared by coating on a 100 μm poly(ethylene terephthalate) support:
1) a subbing layer of oly(acrylonitrile-co-vinylidene chloride-co-acrylic acid) (0.054 g/m$^2$) (14:79:7 wt. ratio); and
2) a dye layer containing a mixture of cyan dye 8, yellow dye II-1 and magenta dye III-2 illustrated above, (each at 0.22 g/m$^2$) and the cyanine infrared absorbing dye illustrated below (0.054 g/m$^2$) in a cellulose acetate propionate binder (2.5% acetyl, 45% propionyl) (0.27 g/m$^2$) coated from dichloromethane.

Comparison dye-donors using a mixture of cyan, yellow and magenta dyes of the prior art as identified below, at a total noverage of 0.66 g/m$^2$, were also prepared.

Cyanine Infrared Absorbing Dye

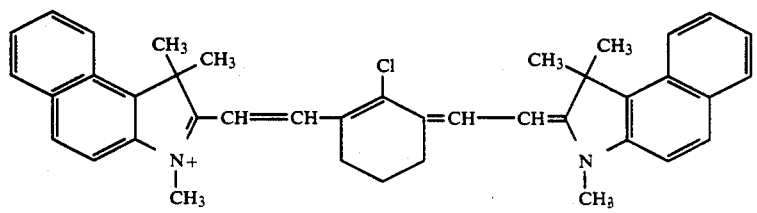

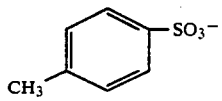

An intermediate dye-receiving element was prepared by coating on an unsubbed 100 μm thick poly(ethylene terephthalate) support a layer of crosslinked poly(styrene-co-divinylbenzene) beads (12 micron average diameter) (0.11 g/m²), triethanolamine (0.09 g/m²) and DC-510® Silicone Fluid (Dow Corning Company) (0.01 g/m²) in a Butar 76 binder, a poly(vinyl alcohol-co-butyral), (Monsanto Company) (4.0 g/m²) from 1,1,2-trichloroethane and dichloromethane.

Single color black images were printed as described below from dye-donors onto a receiver using a laser imaging device as described in U.S. Pat. No. 4,876,235. The laser imaging device consisted of a single diode laser connected to a lens assembly mounted on a translation stage and focused onto the dye-donor layer.

The dye-receiving element was secured to the drum of the diode laser imaging device with the receiving layer facing out. The dye-donor element was secured in face-to-face contact with the receiving element.

The diode laser used was a Spectra Diode Labs No. SDL-2430-H2, having an integral, attached optical fiber for the output of the laser beam, with a wavelength of 816 nm and a nominal power output of 250 milliwatts at the end of the optical fiber. The cleaved face of the optical fiber (100 microns core diameter) was imaged onto the plane of the dye-donor with a 0.33 magnification lens assembly mounted on a translation stage giving a nominal spot size of 33 microns and a measured power output at the focal plane of 115 milliwatts.

The drum, 312 mm in circumference, was rotated at 500 rpm and the imaging electronics were activated. The translation stage was incrementally advanced across the dye-donor by means of a lead screw turned by a microstepping motor, to give a center-to-center line distance of 14 microns (714 lines per centimeter, or 1800 lines per inch). For a continuous tone stepped image, the current supplied to the laser was modulated from full power to 16% power in 4% increments.

After the laser had scanned approximately 12 mm, the laser exposing device was stopped and the intermediate receiver was separated from the dye donor. The intermediate receiver containing the stepped dye image was laminated to Ad-Proof Paper® (Appleton Papers, Inc.) 60 pound stock paper by passage through a pair of rubber rollers heated to 120° C. The polyethylene terephthalate support was then peeled away leaving the dye image and polyvinyl alcohol-co-butyral firmly adhered to the paper. The paper stock was chosen to represent the substrate used for a printed ink image obtained from a printing press.

The Status T density of each of the stepped images was read using an X-Rite® 418 Densitometer to find the single step image within 0.05 density unit of the SWOP Color Reference. For the black standard, this density was 1.6.

The a* and b* values of the selected step image of transferred dye-mixture was compared to that of the SWOP Color Reference reading on an X-Rite® 918 Colorimeter set for D50 illuminant and a 10 degree observer. The L* reading was checked to see that it did not differ appreciably from the reference. The a* and b* readings were recorded and the distance from the SWOP Color Reference calculated as the square root of the sum of differences square for a* and b*:

$$\text{i.e. } \sqrt{(a^*_e - a^*_s)^2 + (b^*_e - b^*_s)^2}$$

e = experiment (transferred dye)
s = SWOP Color Reference

In addition, the above dye-donors were evaluated for storage stability by comparing transmission spectra of the donor before and after incubation at 50° C./50% RH for 4 days.

The following results were obtained:

TABLE 1

| Dyes (Weight Ratio) | a* | b* | Distance From Reference | Density @ 500 rpm | Storage Stability |
|---|---|---|---|---|---|
| SWOP | 1.5 | 2.0 | | | |
| 8/II-1/III-2 (33:33:34) | 0.5 | −0.5 | 2.5 | 1.6 | good |
| 8/II-1/III-1 (37:26:37) | 0.5 | 1 | 1 | 1.8 | good |
| 8/II-22/III-1 (37:23:40) | 3.5 | 1 | 2 | 1.4 | good |
| 1/II-1/III-2 (33:33:34) | 2 | −3 | 5 | 1.7 | good |
| 1/II-22/III-2 (33:28:39) | 5 | −2 | 5 | 1.5 | good |
| Control 1ª (46:27:27) | −1.2ᵇ | −5.4ᵇ | 8.0 | 0.8 | good |
| Control 2ᶜ (54:21:25) | −2.4 | −1.5 | 5.5 | 1.6 | poorᵈ |

ªSimilar to Table C-17 from U.S. Pat. No. 4,923,846, a mixture of Solvent Blue 36, Solvent Red 19 and Foron Brilliant Yellow S-6GL (structures below).
ᵇThe drum speed was reduced to 400 rpm so that sufficient density could be obtained to allow a valid hue comparison.
ᶜSimilar to Example 1 of U.S. Pat. No. 4,186,435 (dye structures below).
ᵈAt room temperature after two days, some of the magenta dye sublimed out of the coating onto an adjacent piece of paper. In addition, after incubation, at least 75% of the absorption due to the cyan dye was lost.

Control 1

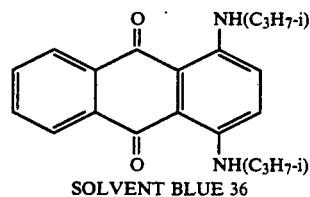

SOLVENT BLUE 36

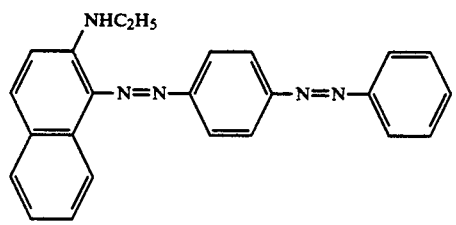

SOLVENT RED 19

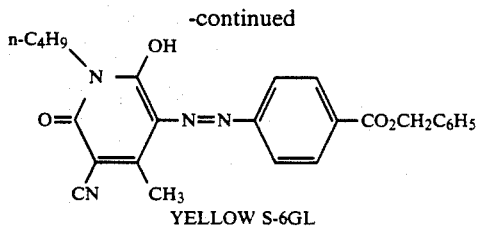

YELLOW S-6GL

Control 2
Cyan

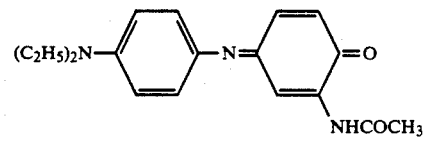

Magenta

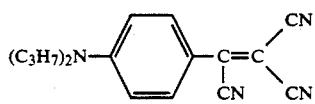

Yellow

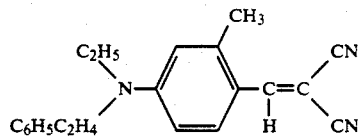

The above results indicate that by using a mixture of cyan, magenta and yellow dyes according to the invention in an appropriate ratio, a hue closely corresponding to that of the black SWOP Color Reference was obtained, in comparison to the controls of the prior art which were further away from the SWOP Color Reference.

Although Control 2 yields high transfer density and a reasonable color match, the storage stability was poor as noted above. Although Control 1 had good storage stability, it was difficult to obtain useful densities.

The invention has been described in detail with particular reference to preferred embodiments thereof, but it will be understood that variations and modifications can be effected within the spirit and scope of the invention.

What is claimed is:

1. A black dye-donor element for thermal dye transfer comprising a support having thereon a dye layer comprising a mixture of at least one cyan, magenta and yellow dyes dispersed in a polymeric binder, at least one of the an dyes having the formula:

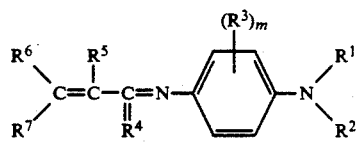

wherein:

$R^1$ and $R^2$ each independently represents hydrogen; a substituted or unsubstituted alkyl group having from 1 to about 10 carbon atoms; a substituted or unsubstituted cycloalkyl group having from about 5 to about 7 carbon atoms or a substituted or unsubstituted allyl group; with the proviso that $R^1$ and $R^2$ cannot both be hydrogen; or $R^1$ and $R^2$ can be joined together to form, along with the nitrogen to which they are attached, a 5- to 7-membered heterocyclic ring;

or either or both of $R^1$ and $R^2$ can be combined with an $R^3$ to form a 5- to 7-membered heterocyclic ring;

each $R^3$ independently represents substituted or unsubstituted alkyl, cycloalkyl or allyl as described above for $R^1$ and $R^2$, alkoxy, aryloxy, halogen, thiocyano, acylamido, ureido, alkylsulfonamido, arylsulfonamido, allthio, arylthio or trifluoromethyl;

or any two of $R^3$ may be combined together to form a 5- or 6-membered carbocyclic or heterocyclic ring; or one or two of $R^3$ may be combined with either or both of $R^1$ and $R^2$ to complete a 5- to 7-membered ring;

m is an integer of from 0 to 4;

$R^4$ represents hydrogen or an electron withdrawing group;

$R^5$ represents an electron withdrawing group, a substitute or unsubstituted aryl group having from about 6 to about 10 carbon atoms or a substituted or unsubstituted hetaryl group having from about 5 to about 10 atoms;

$R^6$ and $R^7$ each independently represents an electron withdrawing group; and $R^6$ and $R^7$ may be combined to form the residue of an active methylene compound;

and at least one of the yellow dyes having the formula:

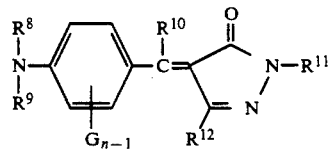

wherein:

$R^8$, $R^9$ and $R^{11}$ each independently represents a substituted or unsubstituted alkyl group of from 1 to about 10 carbon atoms; a cycloalkyl group of from about 5 to about 7 carbon atoms a substituted or unsubstituted allyl group; or an aryl group having from about 6 to about 10 carbon atoms;

or $R^8$ and $R^9$ can be joined together to form, along with the nitrogen to which they are attached, a 5- or 6-membered heterocyclic ring;

or either or both of $R^8$ and $R^9$ can be joined to the carbon atom of the benzene ring at a position ortho to the position of attachment of the anilino nitrogen to form a 5- or 6-membered ring, thus forming a polycyclic system;

$R^{10}$ represents hydrogen; a substituted or unsubstituted alkyl group of from 1 to about 10 carbon atoms; a cycloalkyl group of from about 5 to about 7 carbon atoms; a substituted or unsubstituted allyl group; carbamoyl; or alkoxycarbonyl;

$R^{12}$ represents a substituted or unsubstituted alkoxy group having from 1 to about 10 carbon atoms; a substituted or unsubstituted aryloxy group having from about 6 to about 10 carbon atoms; $NHR^{13}$; $NR^{13}R^{14}$ or the atoms necessary to complete a 6-membered ring fused to the benzene ring;

$R^{13}$ and $R^{14}$ each independently represents any of the groups for $R^8$; or $R^{13}R^{14}$ may be joined together to form, along with the nitrogen to which they are attached, a 5- or 6-membered heterocyclic ring;

n is a positive integer from 1 to 5; and

G represents a substituted or unsubstituted alkyl or alkoxy group of from 1 to about 10 carbon atoms; halogen; aryloxy; or represents the atoms necessary to complete a 5- or 6-membered ring, thus forming a fused ring system;

and at least one of the magenta dyes having the formula:

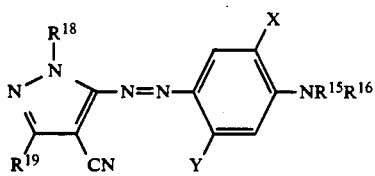

III wherein:

$R^{15}$ is a substituted or unsubstituted alkyl or allyl group of from 1 to about 10 carbon atoms;

X is an alkoxy group of from 1 to about 4 carbon atom or represents the atoms which when taken together with $R^{16}$ forms a 5- or 6-membered ring;

$R^{16}$ is any of the groups for $R^{15}$ or represents the atoms which when taken together with X forms a 5- or 6-membered ring;

Y is $R^{15}$, an alkoxy group of from 1 to about 4 carbon atoms, hydrogen, halogen, or $NHJR^{17}$;

$R^{17}$ is a substituted or unsubstituted alkyl group of from 1 to about 10 carbon atoms, or a substituted or unsubstituted aryl group of from about 6 to about 10 carbon atoms;

J is CO, $CO_2$, $-SO_2-$ or $CONR^{20}-$;

$R^{18}$ is a substituted or unsubstituted alkyl or allyl group of from 1 to about 10 carbon atoms, or a substituted or unsubstituted aryl group of from about 6 to about 10 carbon atoms;

$R^{19}$ is hydrogen, cyano, a substituted or unsubstituted alkyl group of from 1 to about 10 carbon atoms, or a substituted or unsubstituted aryl group of from about 6 to about 10 carbon atoms; and $R^{20}$ is hydrogen or $R^{18}$.

2. The element of claim 1 wherein $R^4$, $R^6$ and $R^7$ in formula I are cyano.

3. The element of claim 1 wherein $R^1$ in formula I is $C_2H_5$, $C_2H_4OH$, or $n-C_3H_7$.

4. The element of claim 1 wherein $R^2$ in formula I is $C_2H_5$ or $n-C_3H_7$.

5. The element of claim 1 wherein $R^3$ in formula I is hydrogen, $OC_2H_5$, $CH_3$ or $NHCOCH_3$.

6. The element of claim 1 wherein $R^5$ in formula I is $p-C_6H_4Cl$, $m-C_6H_4NO_2$ or naphthyl.

7. The element of claim 1 wherein $R^{11}$ is phenyl, $R^{12}$ is ethoxy or $NHR^{13}$, wherein $R^{13}$ is methyl or phenyl, n is 1 and $R^{10}$ is hydrogen.

8. The element of claim 1 wherein $R^{12}$ is O and completes a 6-membered ring fused to the benzene 9. The element of claim 1 wherein $R^{12}$ is $NR^{13}R^{14}$, wherein each $R^{13}$ and is methyl or $R^{13}$ is ethyl and $R^{14}$ is phenyl.

10. The element of claim 1 wherein $R^{12}$ is $NR^{13}R^{14}$, wherein $R^{13}$ and $R^{14}$ are joined together to form, along with the nitrogen to which they are attached, a pyrrolidine or morpholine ring.

11. The element of claim 1 wherein $R^{15}$ and $R^{16}$ are each ethyl, X is $OCH_3$, J is CO, $R^{17}$ and $R^{18}$ are each $CH_3$, and $R^{19}$ is $C_4H_9$-t.

12. The element of claim 1 wherein $R^{15}$ and $R^{16}$ are each ethyl, X is $OCH_3$, J is CO, $R^{17}$ is $CH_3$, $R^{18}$ is $CH_2CHOHCH_3$, and $R^{19}$ is $C_4H_9$-t.

13. The element of claim 1 wherein said dye-donor element contains an infrared-absorbing dye in said dye layer.

14. In a process of forming a dye transfer image comprising imagewise-heating a black dye-donor element comprising a support having thereon a dye layer comprising a mixture of at least one cyan, magenta and yellow dyes dispersed in a polymeric binder, at least one of the cyan dyes having the formula:

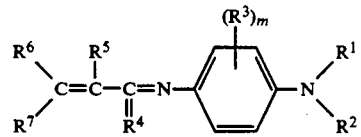

I wherein:

$R^1$ and $R^2$ each independently represents hydrogen; a substituted or unsubstituted alkyl group having from 1 to about 10 carbon atoms; a substitute or unsubstituted cycloalkyl group having from about 5 to about 7 carbon atoms or a substituted or unsubstituted allyl group; with the proviso that $R^1$ and $R^2$ cannot both be hydrogen;

or $R^1$ and $R^2$ can be joined together to form, along with the nitrogen to which they are attached, a 5- to 7-membered heterocyclic ring;

or either or both of $R^1$ and $R^2$ can be combined with an $R^3$ to form a 5- to 7-membered heterocyclic ring;

each $R^3$ independently represents substituted or unsubstituted alkyl, cycloalkyl or allyl as described above for $R^1$ and $R^2$, alkoxy, aryloxy, halogen, thiocyano, acylamido, ureido, alkylsulfonamido, arylsulfonamido, allthio, arylthio or trifluoromethyl; or any two of $R^3$ may be combined together to form a 5- or 6-membered carbocyclic or heterocyclic ring; or one or two of $R^3$ may be combined with either or both of $R^1$ and $R^2$ to complete a 5- to 7-membered ring;

m is an integer of from 0 to 4;

$R^4$ represents hydrogen or an electron withdrawing group;

$R^5$ represents an electron withdrawing group, a substituted or unsubstituted aryl group having from about 6 to about 10 carbon atoms or a substituted or unsubstituted hetaryl group having from 5 to about 10 atoms;

$R^6$ and $R^7$ each independently represents an electron withdrawing group; and $R^6$ and $R^7$ may be combined to form the residue of an active methylene compound;

and at least one of the yellow dyes having the formula:

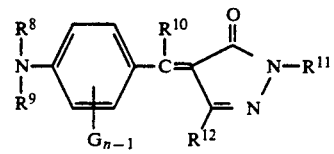

II wherein
R⁹ and R¹¹ each independently represents a substituted or unsubstituted alkyl group of from 1 to about 10 carbon atoms; a cycloalkyl group of from about 5 to about 7 carbon atoms; a substituted or unsubstituted allyl group; or an aryl group having from about 6 to about 10 carbon atoms; or R⁸ and R⁹ can be joined together to form, along with the nitrogen to which they are attached, a 5- or 6-membered heterocyclic ring;

or either or both of R⁸ and R⁹ can be joined to the carbon atom of the benzene ring at a position ortho to the position of attachment of the anilino nitrogen to form a 5- or 6-membered ring, thus forming a polycyclic system;

R¹⁰ represents hydrogen; a substituted or unsubstituted alkyl group of from 1 to about 10 carbon atoms a cycloalkyl group of from about 5 to about 7 carbon atoms; a substituted or unsubstituted allyl group; carbamoyl; or alkoxycarbonyl;

R¹² represents a substituted or unsubstituted alkoxy group having from 1 to about 10 carbon atoms; a substituted or unsubstituted aryloxy group having from about 6 to about 10 carbon atoms; NHR¹³ NR¹³R¹⁴ or the atoms necessary to complete a 6-membered ring fused to the benzene ring;

R¹³ and R¹⁴ each independently represents any of the groups for R⁸; or R¹³ and R¹⁴ may be joined together to form, along with the nitrogen to which they are attached, a 5- or 6-membered heterocyclic ring;

n is a positive integer from 1 to 5; and

G represents a substituted or unsubstituted alkyl or alkoxy group of from 1 to about 10 carbon atoms; halogen; aryloxy; or represents the atoms necessary to complete a 5- or 6-membered ring, thus forming a fused ring system;

and at least one of the magenta dyes having the formula:

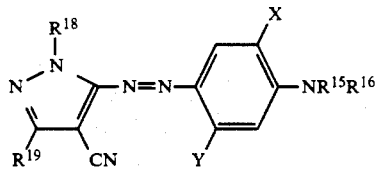

wherein:
R¹⁵ is a substituted or unsubstituted alkyl or allyl group of from 1 to about 10 carbon atoms;

X is an alkoxy group of from 1 to about 4 carbon atoms or represents the atoms which when taken together with R¹⁶ forms a 5- or 6-membered ring;

R¹⁶ is any of the groups for R¹⁵ or represents the atoms which when taken together with X forms a 5- or 6-membered ring;

Y is R¹⁵, an alkoxy group of from 1 to about 4 carbon atoms, hydrogen, halogen, or NHJR¹⁷;

R¹⁷ is a substituted or unsubstituted alkyl group of from 1 to about 10 carbon atoms, or a substituted or unsubstituted aryl group of from about 6 to about 10 carbon atoms;

J is CO, CO₂, —SO₂— or CONR²⁰—;

R¹⁸ is a substituted or unsubstituted alkyl or allyl group of from 1 to about 10 carbon atoms, or a substituted or unsubstituted aryl group of from about 6 to about 10 carbon atoms;

R¹⁹ is hydrogen, cyano, a substituted or unsubstituted alkyl group of from 1 to about 10 carbon atoms, or a substituted or unsubstituted aryl group of from about 6 to about 10 carbon atoms; and R²⁰ is hydrogen or R¹⁸.

15. The process of claim 14 wherein said dye-donor element contains an infrared-absorbing dye in said dye layer.

16. In a thermal de transfer assemblage comprising:
a) a black dye-donor element comprising a support having thereon a dye layer comprising a mixture of cyan, yellow and magenta dyes dispersed in a polymeric binder, and
b) a dye-receiving element comprising a support having thereon a dye image-receiving layer, said dye-receiving element being in a superposed relationship with said black dye-donor element so that said dye layer is in contact with said dye image-receiving layer, the improvement wherein at least one of the cyan dyes has the formula:

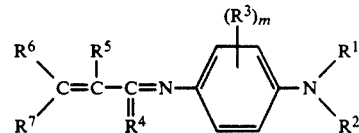

wherein
R¹ and R² each independently represents hydrogen; a substituted or unsubstituted alkyl group having from 1 to about 10 carbon atoms; a substituted or unsubstituted cycloalkyl group having from about 5 to about 7 carbon atoms or a substituted or unsubstituted allyl group; with the proviso that R¹ and R² cannot both be hydrogen;

or R¹ and R² can be joined together to form, along with the nitrogen to which they are attached, a 5- to 7-membered heterocyclic ring;

or either or both of R¹ and R² can be combined with an R³ to form a 5- to 7-membered heterocyclic ring;

each R³ independently represents substituted or unsubstituted alkyl, cycloalkyl or allyl as described above for R¹ and R², alkoxy, aryloxy, halogen, thiocyano, acylamido, ureido, alkylsulfonamido, arylsulfonamido, alkylthio, arylthio or trifluoromethyl; or any two of R³ may be combined together to form a 5- or 6-membered carbocyclic or heterocyclic ring; or one or two of R³ may be combined with either or both of R¹ and R² to complete a 5- to 7-membered ring;

m is an integer of from 0 to 4;

R⁴ represents hydrogen or an electron withdrawing group;

R⁵ represents an electron withdrawing group, a substituted or unsubstituted aryl group having from about 6 to about 10 carbon atoms or a substituted or unsubstituted hetaryl group having from about 5 to about 10 atoms;

R⁶ and R⁷ each independently represents an electron withdrawing group; and

R⁶ and R⁷ may be combined to form the residue of an active methylene compound;

and at least one of the yellow dyes having the formula:

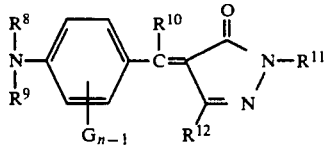

II wherein:

- $R^8$, $R^9$ and $R^{11}$ each independently represents a substituted or unsubstituted alkyl group of from 1 to about 10 carbon atoms; a cycloalkyl group of from about 5 to about 7 carbon atoms; a substituted or unsubstituted allyl group; or an aryl group having from about 6 to about 10 carbon atoms; or $R^8$ and $R^9$ can be joined together to form, along with the nitrogen to which they are attached, a 5- or 6-membered heterocyclic ring;

or either or both of $R^8$ and $R^9$ can be joined to the carbon atom of the benzene ring at a position ortho to the position of attachment of the anilino nitrogen to form a 5- or 6-membered ring, thus forming a polycyclic system;

- $R^{10}$ represents hydrogen; a substituted or unsubstituted alkyl group of from 1 to about 10 carbon atoms; a cycloalkyl group of from about 5 to about 7 carbon atoms; a substituted or unsubstituted allyl group; carbamoyl; or alkoxycarbonyl;

- $R^{12}$ represents a substituted or unsubstituted alkoxy group having from 1 to about 10 carbon atoms a substituted or unsubstituted aryloxy group having from about 6 to about 10 carbon atoms; $NHR^{13}$; $NR^{13}R^{14}$ or the atoms necessary to complete a 6-membered ring fused to the benzene ring;

- $R^{13}$ and $R^{14}$ each independently represents any of the groups for $R^8$; or $R^{13}$ and $R^{14}$ may be joined together to form, along with the nitrogen to which they are attached, a 5- or 6-membered heterocyclic ring;

- n is a positive integer from 1 to 5; and

- G represents a substituted or unsubstituted alkyl or alkoxy group of from 1 to about 10 carbon atoms; halogen; aryloxy; or represents the atoms necessary to complete a 5- or 6-membered ring, thus forming a fused ring system;

and at least one of the magenta dyes having the formula:

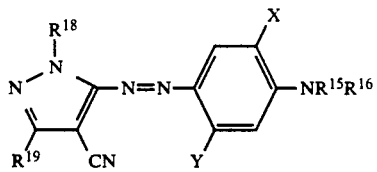

III wherein:

- $R^{15}$ is a substituted or unsubstituted alkyl or allyl group of from 1 to about 10 carbon atoms;

- X is an alkoxy group of from 1 to about 4 carbon atoms or represents the atoms which when taken together with $R^{16}$ forms a 5- or 6-membered ring;

- $R^{16}$ is any of the groups for $R^{15}$ or represents the atoms which when taken together with X forms a 5- or 6-membered ring;

- Y is $R^{15}$, an alkoxy group of from 1 to about 4 carbon atoms, hydrogen, halogen, or $NHJR^{17}$;

- $R^{17}$ is a substituted or unsubstituted alkyl group of from 1 to about 10 carbon atoms, or a substituted or unsubstituted aryl group of from about 6 to about 10 carbon atoms;

- J is CO, $CO_2$, $-SO_2-$ or $CONR^{20}-$;

- $R^{18}$ is a substituted or unsubstituted alkyl or allyl group of from 1 to about 10 carbon atoms, or a substituted or unsubstituted aryl group of from about 6 to about 10 carbon atoms;

- $R^{19}$ is hydrogen, cyano, a substituted or unsubstituted alkyl group of from 1 to about 10 carbon atoms, or a substituted or unsubstituted aryl group of from about 6 to about 10 carbon atoms; and

- $R^{20}$ is hydrogen or $R^{18}$.

17. The assemblage of claim 16 wherein said dye-donor element contains an infrared-absorbing dye in said dye layer.

* * * * *

UNITED STATES PATENT AND TRADEMARK OFFICE
CERTIFICATE OF CORRECTION

PATENT NO. : 5,134,116
DATED : July 28, 1992
INVENTOR(S) : D. D. Chapman, et al

It is certified that error appears in the above-indentified patent and that said Letters Patent is hereby corrected as shown below:

Column 21, line 54: replace "an" with --cyan--.

Column 22, line 12: replace "allthio" with --alkylthio--.

Column 23, line 61: after "benzene" add --ring.--.

Column 23, line 63: after "$R^{13}$ and" add --$R^{14}$--.

Column 24, line 41: replace "allthio" with --alkylthio--.

Column 25, line 2: before "$R^9$" add --$R^8$,--.

Column 27, line 10: replace "R8" with --$R^8$--.

Signed and Sealed this

Twenty-eighth Day of September, 1993

Attest:

BRUCE LEHMAN

Attesting Officer     Commissioner of Patents and Trademarks